United States Patent
Park et al.

(10) Patent No.: US 8,304,264 B2
(45) Date of Patent: Nov. 6, 2012

(54) APPARATUS AND METHOD FOR MONITORING CHAMBER STATUS IN SEMICONDUCTOR FABRICATION PROCESS

(75) Inventors: Sang-Wuk Park, Hwaseong-si (KR); Woo-Seok Kim, Hwaseong-si (KR); Yong-Jin Kim, Suwon-si (KR)

(73) Assignee: Samsung Electronics, Co., Ltd., Suwon-si, Gyeonggi-do (KR)

( * ) Notice: Subject to any disclaimer, the term of this patent is extended or adjusted under 35 U.S.C. 154(b) by 276 days.

(21) Appl. No.: 12/858,691

(22) Filed: Aug. 18, 2010

(65) Prior Publication Data

US 2011/0063128 A1 Mar. 17, 2011

(30) Foreign Application Priority Data

Sep. 14, 2009 (KR) .................. 10-2009-0086452

(51) Int. Cl.
*G01R 31/26* (2006.01)
(52) U.S. Cl. ......... 438/16; 438/14; 438/5; 257/E21.525; 216/60
(58) Field of Classification Search .............. 438/14, 438/5; 257/E21.525; 216/60
See application file for complete search history.

(56) References Cited

U.S. PATENT DOCUMENTS

| 7,101,805 B2 | 9/2006 | Johnson et al. |
| 7,741,601 B2 * | 6/2010 | Noji et al. .................. 250/310 |
| 2006/0012796 A1 | 1/2006 | Saito et al. |

FOREIGN PATENT DOCUMENTS

| JP | 2005-317341 | 11/2005 |
| JP | 2006-032959 | 2/2006 |
| KR | 10-2003-0000274 A | 1/2003 |

\* cited by examiner

*Primary Examiner* — Arnold Kinkead
(74) *Attorney, Agent, or Firm* — Lee & Morse, P.C.

(57) ABSTRACT

A chamber-status monitoring apparatus includes a plurality of chambers, a time-division multiplexer configured to receive, via optical fiber probes, optical signals from each chamber, to divide each optical signal into first time slots having a predetermined duration, and to multiplex the first time slots to generate an OTDM signal, a multi-input optical emission spectroscope configured to receive and disperse the OTDM signal according to wavelengths to measure spectrum information, and a controller configured to divide the spectrum information of the dispersed OTDM signal into second time slots with a predetermined time interval therebetween, to classify the second time slots according to the chambers to obtain spectrum information of the optical signals of the individual chambers, and to control endpoint detection in each of the chambers in accordance with the spectrum information of the optical signal of the corresponding chamber.

13 Claims, 4 Drawing Sheets

APPARATUS AND METHOD FOR MONITORING CHAMBER STATUS IN SEMICONDUCTOR FABRICATION PROCESS

BACKGROUND

1. Field

Embodiments relate to a chamber-status monitoring apparatus and a method capable of simultaneously measuring the statuses of a plurality of chambers in a semiconductor fabrication process by use of a multi-input optical emission spectroscope.

2. Description of the Related Art

Typically, in the semiconductor fabrication process, a plasma etching process is utilized to remove or etch material patterned on a silicon substrate. For example, once a semiconductor substrate with an overlying patterned, protective layer is positioned within a chamber, an ionizable, dissociative gas mixture is introduced within the chamber at a prespecified flow rate, while a vacuum pump is throttled to achieve an ambient process pressure. Thereafter, plasma is formed when a fraction of the gas mixture in the chamber is ionized by heated electrons, e.g., heated via either inductive or capacitive power supply. Moreover, the heated electrons serve to dissociate some species of the gas mixture and create reactant specie(s) suitable for the exposed surface etch chemistry.

Once the plasma is formed, selected surfaces of the substrate are etched by the plasma. The process is adjusted to achieve optimal conditions, e.g., an appropriate concentration of desirable reactant and ion populations to etch various features in the selected regions of substrate. The etched materials, e.g., the substrate or layers thereon, may include silicon dioxide ($SiO_2$), low-k dielectric materials, poly-silicon, and silicon nitride. As the feature size is reduced and the number and complexity of the etching process steps used during integrated circuit fabrication is increased, the requirements for tight process control become more stringent. Consequently, real time monitoring and control of such processes becomes increasingly important in the semiconductor fabrication.

For example, one such monitoring technique may include endpoint detection, which determines timely completion of an etching step or process. In particular, endpoint detection refers to a detection of a completed etched feature or to an instant in time when the etch front reaches an etch stop layer. If the endpoint detection is inaccurate, severe under-cutting of features may occur due to over-etching, or partially completed features may result due to under-etching. As a result, poor endpoint detection could lead to devices of poor quality that are subject to increased risk of failure. Therefore, accurate and precise completion of an etching process is important in the semiconductor fabrication.

SUMMARY

Embodiments are therefore directed to an apparatus and method for monitoring chamber status in a semiconductor manufacturing process, which substantially overcome one or more of the problems due to the limitations and disadvantages of the related art.

It is therefore a feature of an embodiment to provide a chamber-status monitoring apparatus and method for use in a semiconductor fabrication, which use a multi-input optical emission spectroscope to simultaneously monitor status of multiple chambers without performing calibration control on the optical emission spectroscope in accordance with a change in the status of the optical emission spectroscope so as to reduce the cost.

It is therefore another feature of an embodiment to provide a chamber-status monitoring apparatus and method for use in a semiconductor fabrication, which allow one optical emission spectroscope to simultaneously measure status of a plurality of chambers by using a time division multiplexing scheme.

It is yet another feature of an embodiment to provide a chamber-status monitoring apparatus and method for use in a semiconductor fabrication, which are capable of low-cost high-resolution measurement and of preventing a measurement error between chambers connected to one optical emission spectroscope.

It is still another feature of an embodiment to provide a chamber-status monitoring apparatus and method for use in a semiconductor fabrication, which is capable of measuring the status of multiple points of each chamber.

At least one of the above and other features and advantages may be realized by providing a chamber-status monitoring apparatus for use in semiconductor fabrication, the apparatus including a plurality of chambers configured to perform etching processes on semiconductor wafers, a time-division multiplexer connected to each of the chambers via at least one respective optical fiber probe, the time-division multiplexer being configured to receive, via the at least one respective optical fiber probe, an optical signal from each chamber in accordance with corresponding plasma emission in the chamber, to divide each optical signal into first time slots having a predetermined duration, and to multiplex the first time slots of all the optical signals to generate an optical time-division multiplexed (OTDM) signal, a multi-input optical emission spectroscope connected to the time-division multiplexer via a single optical fiber probe, the multi-input optical emission spectroscope being configured to receive the dispersed OTDM signal from the time-division multiplexer and to disperse the OTDM signal according to wavelengths to measure spectrum information, and a controller configured to divide the spectrum information of the OTDM signal into second time slots with a predetermined time interval therebetween, to classify the second time slots according to the chambers to obtain spectrum information of the optical signals of the individual chambers, and to control endpoint detection in each of the chambers in accordance with the spectrum information of the optical signal of the corresponding chamber.

The multi-input optical emission spectroscope may include a grating configured to disperse the OTDM signal according to wavelengths, a CCD module configured to convert the dispersed OTDM signal into an electrical signal, and a signal processor configured to process the electrical signal to obtain the spectrum information of the OTDM signal and to output the spectrum information of the OTDM signal to the controller.

The controller may be configured to classify the spectrum information of the OTDM signal into the spectrum information of the optical signals of the individual chambers by collecting the second time slots at time intervals of $(N_{max}-1) \cdot \Delta T + N_{max} \cdot \delta$, wherein $N_{max}$ is a maximum allowable number of chambers, $\Delta T$ is the predetermined duration of the first time slots, and $\delta$ is the predetermined time interval between the second time slots.

Each of the plurality of chambers may be connected to the time-division multiplexer via a plurality of optical fiber probes, each of the plurality of optical fiber probes being connect to a different position within a respective chamber.

At least one of the above and other features and advantages may also be realized by providing a chamber-status monitoring apparatus for use in semiconductor fabrication, the apparatus including a plurality of chambers configured to perform etching processes on semiconductor wafers, a time-division multiplexer connected to each of the chambers via at least one respective optical fiber probe, the time-division multiplexer being configured to receive via the at least one respective optical fiber probe an optical signal from each chamber in accordance with corresponding plasma emission in the chamber, to divide each optical signal into first time slots having a predetermined duration, and to multiplex the first time slots of all the optical signals to generate an OTDM signal, a multi-input optical emission spectroscope connected to the time-division multiplexer via a single optical fiber probe, the multi-input optical emission spectroscope being configured to receive the OTDM signal from the time-division multiplexer, to disperse the OTDM signal according to wavelengths to measure spectrum information, to divide the spectrum information of the OTDM signal into second time slots with a predetermined time interval therebetween, and to classify the second time slots according to the chambers to obtain spectrum information of the optical signals of the individual chambers, and a controller configured to control endpoint detection in each of the chambers in accordance with the spectrum information of the optical signal of the corresponding chamber.

The multi-input optical emission spectroscope may include a grating configured to disperse the OTDM signal according to wavelengths, a CCD module configured to convert the dispersed OTDM signal into an electrical signal, and a signal processor configured to process the electrical signal to obtain the spectrum information of the OTDM signal, to divide the spectrum information of the OTDM signal into the second time slots, to classify the second time slots according to the chambers to obtain spectrum information of the optical signals of the individual chambers, and to output the spectrum information of the optical signals of the individual chambers to the controller.

The multi-input optical emission spectroscope may be configured to classify the spectrum information of the OTDM signal into the spectrum information of the optical signals of the individual chambers by collecting the second time slots at time intervals of $(N_{max}-1)\cdot \Delta T+N_{max}\cdot \delta$, wherein $N_{max}$ is a maximum allowable number of chambers, $\Delta T$ is the predetermined duration of the first time slots, and $\delta$ is the predetermined time interval between the second time slots.

Each of the plurality of chambers may be connected to the time-division multiplexer via a plurality of optical fiber probes, each of the plurality of optical fiber probes being connect to a different position within a respective chamber.

At least one of the above and other features and advantages may also be realized by providing a chamber-status monitoring method for use in semiconductor fabrication, the method including receiving via a plurality of optical fiber probes optical signals from each of a plurality of respective chambers in accordance with corresponding plasma emission during etching in the chambers, dividing each optical signal into first time slots having a predetermined duration, and multiplexing the first time slots of all the optical signals to generate an OTDM signal for a single multi-input optical emission spectroscope, dispersing the OTDM signal according to wavelengths to measure spectrum information, dividing the spectrum information of the OTDM signal into second time slots with a predetermined time interval therebetween, classifying the second time slots according to the chambers to obtain spectrum information of the optical signals of the individual chambers, and controlling endpoint detection in each of the chambers in accordance with the spectrum information of the optical signal of the corresponding chamber.

Dividing the spectrum information and classifying the second time slots may be performed by the multi-input optical emission spectroscope.

Dividing the spectrum information and classifying the second time slots may be performed by a controller.

Classifying the second time slots may include collecting the second time slots at time intervals of $(N_{max}-1)\cdot \Delta T+N_{max}\cdot \delta$, wherein $N_{max}$ is a maximum allowable number of chambers, $\Delta T$ is the predetermined duration of the first time slots, and $\delta$ is the predetermined time interval between the second time slots.

Controlling the endpoint detection may be performed simultaneously in all the chambers via a single multi-input optical emission spectroscope.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2009-0086452, filed on Sep. 14, 2009, in the Korean Intellectual Property Office, and entitled: "Apparatus and Method for Monitoring Chamber Status in Semiconductor Fabrication Process," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of elements and regions may be exaggerated for clarity of illustration. It will also be understood that when an element is referred to as being "between" two elements or "connected to" an element, it can be the only element between the two elements or connected to the element, or one or more intervening elements may also be present. Like reference numerals refer to like elements throughout.

Unless otherwise defined, all terms (including technical and scientific terms) used herein have the same meaning as commonly understood by one skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
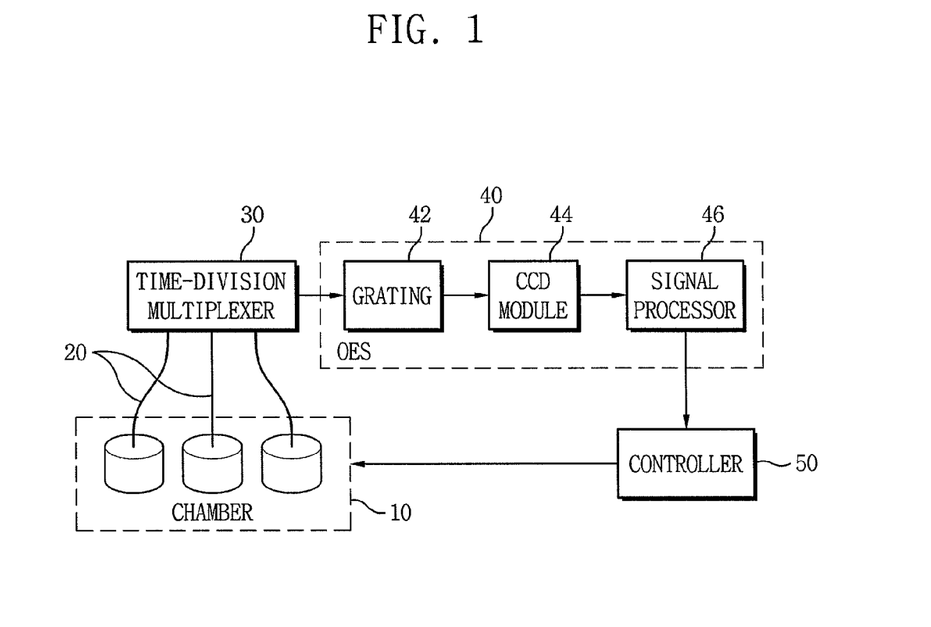
FIG. 1 illustrates a schematic diagram of a chamber-status monitoring apparatus for use in a semiconductor fabrication according to an embodiment.
Figure 2:
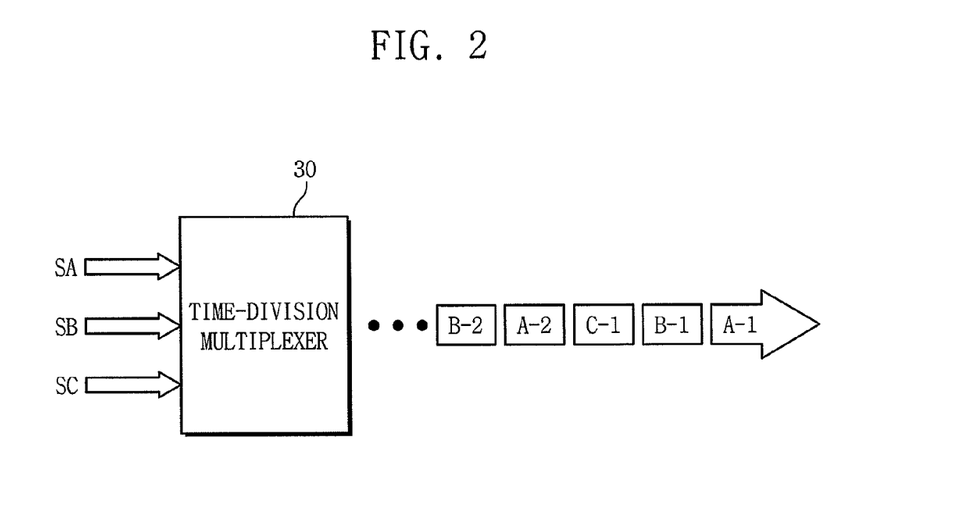
FIG. 2 illustrates a diagram of time division multiplexing of optical signals applicable to an embodiment.
Figure 3:
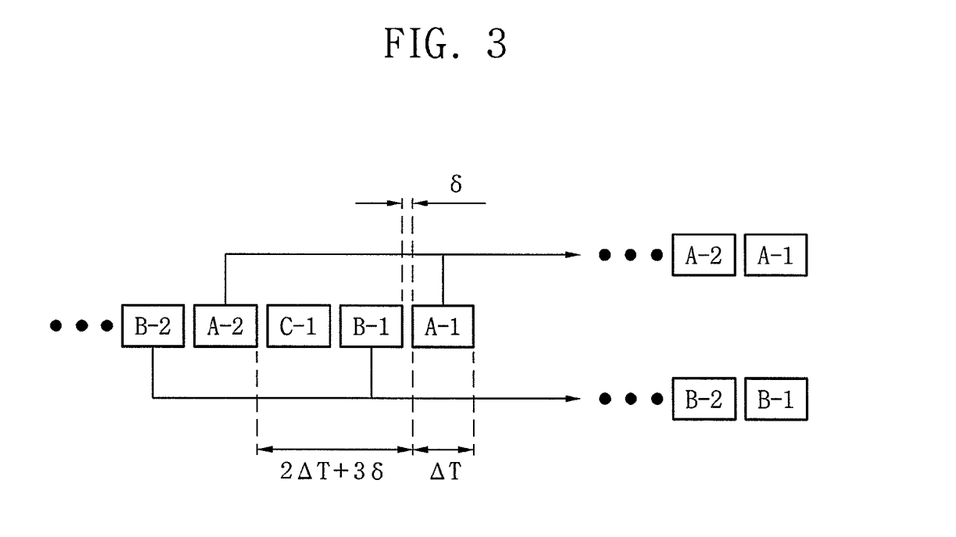
FIG. 3 illustrates a diagram of a division of an optical time-division multiplexed signal into original optical signals.

A chamber-status monitoring apparatus for use in a semiconductor fabrication is described below with reference to FIGS. 1-3. FIG. 1 illustrates a schematic diagram of a chamber-status monitoring apparatus according to an embodiment, FIG. 2 illustrates a diagram of time division multiplexing of optical signals applicable to embodiments, and FIG. 3 illustrates a diagram of dividing of an optical time-division multiplexed (OTDM) signal into original optical signals.

Referring to FIG. 1, a chamber-status monitoring apparatus according to an embodiment may include a plurality of chambers 10, a time-division multiplexer 30, a multi-input optical emission spectroscope (OES) 40, and a controller 50.

The plurality of chambers 10 is for etching processes. That is, semiconductor wafers may be etched in the chambers 10 via plasma, and optical signals may be output from respective chambers 10 according to plasma emission therein during the etching processes. The optical signals may be output from the chambers 10 to the time-division multiplexer 30 through respective optical fiber probes 20.

The time-division multiplexer 30 may be connected to the chambers 10 by the optical fiber probes 20, e.g., each chamber 10 may be connected to the time-division multiplexer 30 via at least one optical fiber probe 20. When the time-division multiplexer 30 receives, e.g., simultaneously, the optical signals output by the chambers 10, i.e., according to plasma emission from the chambers 10, through the optical fiber probes 20, the time-division multiplexer 30 may perform time-division multiplexing on the optical signals to obtain an OTDM signal and output the OTDM signal to the multi-input optical emission spectroscope 40 through one optical fiber probe 20. For example, as shown in FIG. 2, when receiving first to third optical signals SA, SB, and SC from first to third chambers 10, the time-division multiplexer 30 divides the optical signals into time slots and alternately and consecutively transmits the time slots to the multi-input optical emission spectroscope 40. Assuming that the first optical signal SA is divided into time slots A-1, A-2, A-3, . . . , the second optical signal SB is divided into time slots B-1, B-2, B-3, . . . , and the third optical signal SC is divided into time slots C-1, C-2, C-3, . . . , the OTDM signal is transmitted to the multi-input optical emission spectroscope 40 in order of the time slots A-1, B-1, C-1, A-2, B-2, C-2, . . . .

In the time-division multiplexing scheme adapted by the time-division multiplexer 30, switching of an input terminal from one optical source, e.g., a chamber 10, to another optical source uses a mechanical scheme. During switching from one optical source to another optical source, e.g., switching between the optical fiber probes 20 connected to the different chambers 10, light may be off or an amount of light may not be constant for a short period time. Moreover, as the number of optical sources increases, a time interval between optical signals from a same optical source may increase. In detail, referring to FIG. 3 wherein a maximum allowable number of measured optical sources is three, a duration of each time slot of an optical signal is referred to as $\Delta T$, and a time interval between time slots of two sequential optical signals, e.g., of different sources, is referred to as $\delta$. As illustrated in FIG. 3, the time slots having the duration of $\Delta T$ may be collected at time intervals of $2\Delta T+3\delta$, i.e., time between two sequential optical signals from a same source, to obtain spectrum information. That is, as at least one of the number of measured optical sources and the duration of time slots to be corrected increases, a response speed to a variation in the characteristics of each optical source may decrease. Therefore, the maximum number of measured optical sources which the multi-input optical emission spectroscope 40 allows may be limited by mechanical limitations of the time-division multiplexer 30 and the duration of time slots. It is noted that the measured spectrum information may be used to identify a wavelength, e.g., based on emission strength at a predetermined wavelength in time, of a chemical species revealing a remarkable change at an endpoint of an etching process, thereby detecting the endpoint.

The multi-input optical emission spectroscope 40 receives the OTDM signal from the time-division multiplexer 30, measures spectrum information based on wavelengths from the OTDM signal, and outputs the spectrum information to the controller 50. That is, one multi-input optical emission spectroscope 40 may simultaneously measure spectrum information of optical signals generated according to plasma emission in a plurality of chambers 10. The above-mentioned scheme is applicable because a process speed of a general optical emission spectroscope (about 20 msec) is much less than a requirement for endpoint detection (about 100 msec to 1000 msec). In semiconductor fabrication equipment, one or more chambers may be connected to one optical emission spectroscope.

The multi-input optical emission spectroscope 40 may include a grating 42, a charge coupled device (CCD) module 44, and a signal processor 46. The grating 42 disperses the OTDM signal from the time-division multiplexer 30 according to wavelengths. The CCD module 44 converts the dispersed optical signals into electrical signals. The signal processor 46 processes the electrical signals to obtain spectrum information of the OTDM signal and outputs the spectrum information to the controller 50. The time-division multiplexer 30 and the multi-input optical emission spectroscope 40 may be integrated.

The controller 50 may be a personal computer (PC) for controlling an etching process in a semiconductor fabrication. The controller 50 divides the spectrum information of the OTDM signal from the multi-input optical emission spectroscope 40 into time slots to obtain spectrum information of an optical signal regarding each chamber 10, and controls endpoint detection on the corresponding chamber 10 on the basis of the spectrum information. For example, if the spectrum information of the OTDM signal from the multi-input optical emission spectroscope 40 is received in order of time slots A-1, B-1, C-1, A-2, B-2, C-2, . . . , as shown in FIG. 3, the controller 50 may process the spectrum information by using software to obtain spectrum information of an optical signal regarding each chamber 10 and control endpoint detection in the corresponding chamber 10. That is, when the duration of each one of the time slots of the optical signals is $\Delta T$ and a time interval between sequential optical signals is $\delta$, the controller 50 may collect time slots having the duration of $\Delta T$ at time intervals of $T_{controller}$, where $T_{controller}=(N_{max}-1)\cdot\Delta T+N_{max}\cdot\delta$, and $N_{max}$ refers to a maximum allowable number of measured optical sources, and may control endpoint detection of each chamber 10 on the basis of the spectrum information. For example, as illustrated in FIG. 3, when the maximum allowable number of measured optical sources is three, $T_{controller}=2\Delta T+3\delta$.

In the above-mentioned embodiment, the multi-input optical emission spectroscope 40 may measure spectrum information of the OTDM signal with respect to the chambers 10, and the controller 50 may process the spectrum information by using software to obtain the original signals and may control endpoint detection on the individual chambers 10 on the basis of the original signals.

In another embodiment, obtaining the original signals from the OTDM signal may be performed in the multi-input optical emission spectroscope 40 and not in the controller 50. In this case, the multi-input optical emission spectroscope 40 may receive the OTDM signal from the time-division multiplexer 30, disperse the OTDM signal according to wavelengths to obtain the spectrum information, and also collect the time slots at predetermined time intervals to obtain spectrum information of an optical signal of each chamber 10 and output the spectrum information of the optical signal of each chamber 10 to the controller 50. Then, the controller 50 may control endpoint detection in each chamber 10 on the basis of the spectrum information of the optical signal of the corresponding chamber 10.

That is, after the CCD module 44 processes the electrical signals and obtains the spectrum information of the OTDM signal, the signal processor 46 of the multi-input optical emission spectroscope 40 may collect the time slots of the obtained spectrum information at the predetermined time intervals to obtain the spectrum information of the optical signal of each chamber 10 and output the spectrum information of the optical signal of each chamber 10 to the controller 50 which controls endpoint detection in the corresponding chamber 10. When the duration of each one of the time slots of the optical signals is $\Delta T$ and a time interval between time slots of sequential optical signals is $\delta$, as illustrated in FIG. 3, the signal processor 46 of the multi-input optical emission spectroscope 40 may collect time slots at time intervals that equal $(N_{max}-1) \cdot \Delta T + N_{max} \cdot \delta$, in order to obtain the spectrum information of the optical signal per chamber 10, and output the spectrum information of the optical signal per chamber 10 to the controller 50 which controls endpoint detection in each chamber 10 on the basis of the spectrum information of the corresponding chamber 10.

Figure 4:
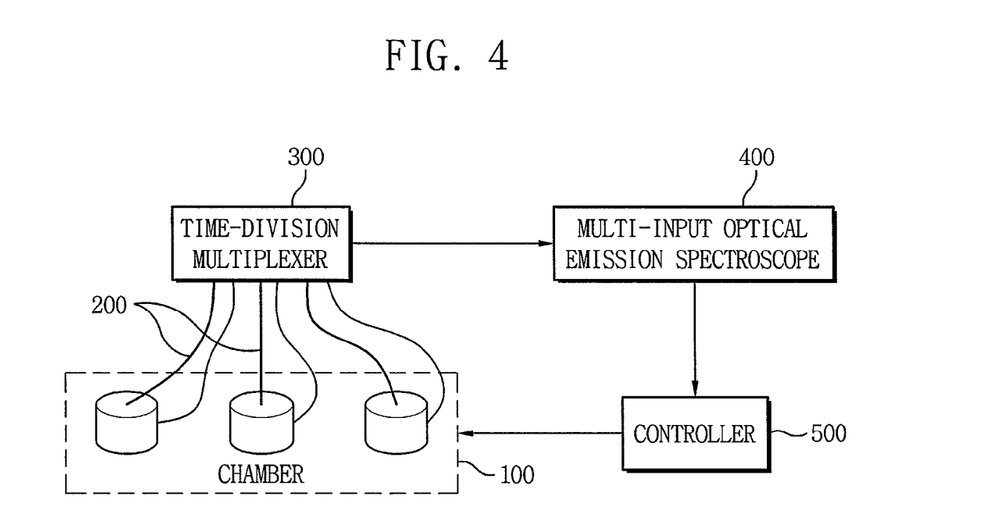
FIG. 4 illustrates a schematic diagram of a chamber-status monitoring apparatus for use in semiconductor fabrication according to another embodiment.

In another embodiment, as illustrated in FIG. 4, each of a plurality of chambers 100 may be connected to a time-division multiplexer 300 by two or more optical fiber probes 200. That is, each of the plurality of chambers 100 may transmit optical signals according to plasma emission to a multi-input optical emission spectroscope 400 through two or more optical fiber probes 200 connected at different positions of the corresponding chamber 100. The time-division multiplexer 300 may generate an OTDM signal from the optical signals of the individual chambers 100 and may output the OTDM signal to the multi-input optical emission spectroscope 400. The accuracy of endpoint detection by a controller 500 in the configuration shown in FIG. 4 may be higher than that in the configuration illustrated in FIG. 1, i.e., where each chamber 10 is connected to the time-division multiplexer 30 by a single optical fiber probe 20 to measure the status of the chamber 10 at one position, resulting in an improved degree of precision of an etching process. If the status of each chamber 100 is measured at a plurality of positions, it may be easy to measure a spatial profile when endpoint control is performed.

Figure 5:
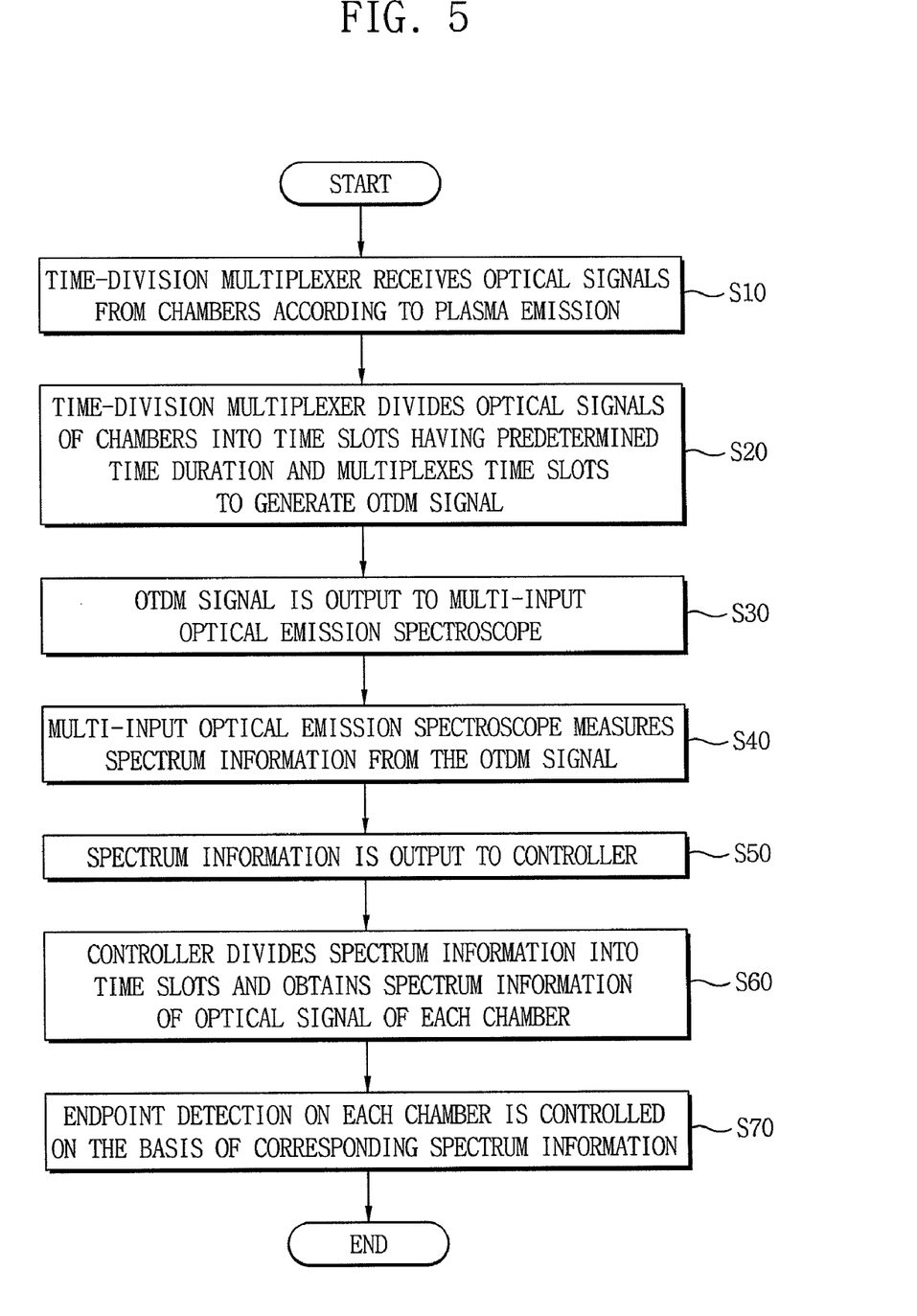
FIG. 5 illustrates a flow chart of an example of a chamber-status monitoring method in a semiconductor fabrication according to another embodiment.
Figure 6:
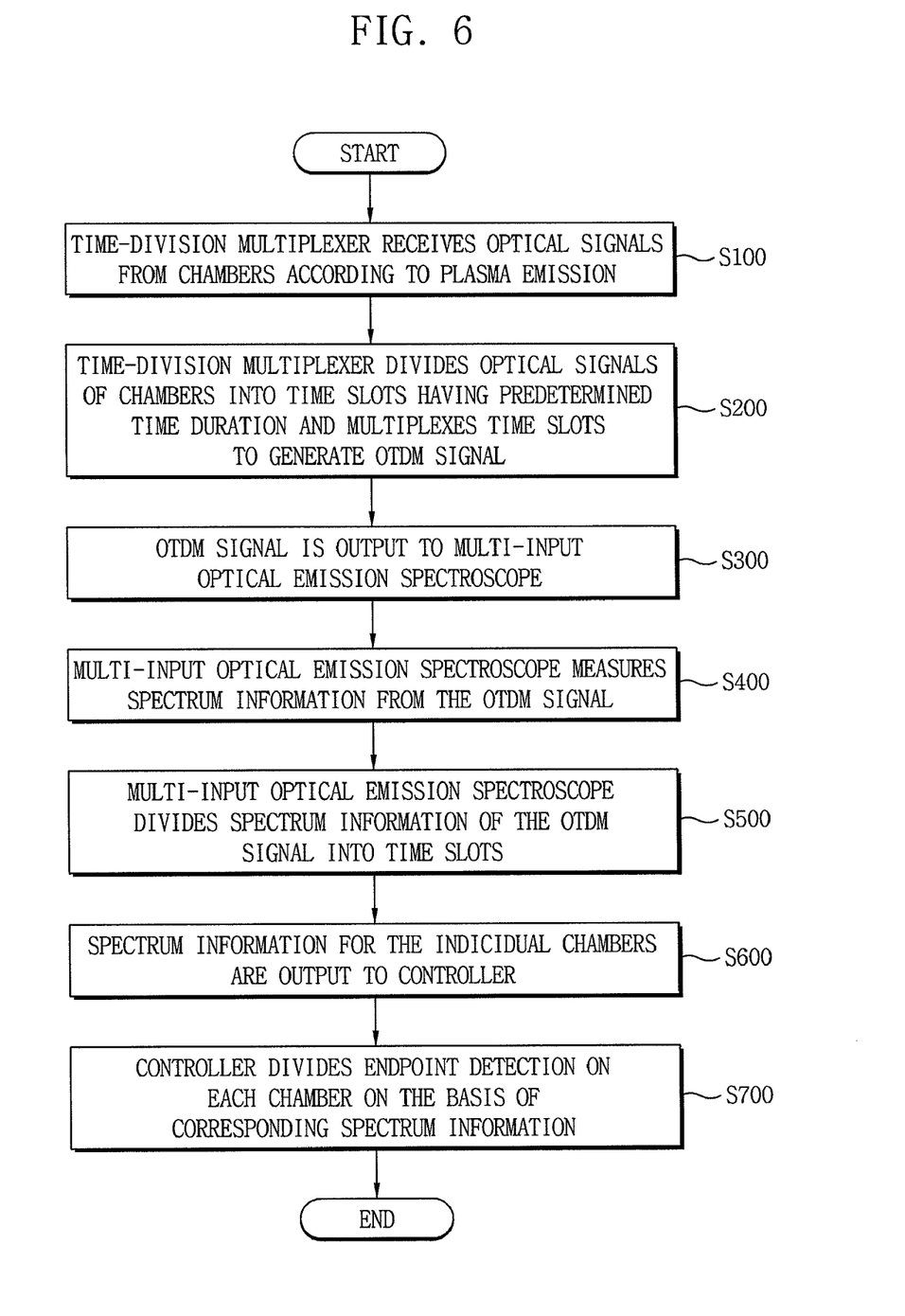
FIG. 6 illustrates a flow chart of an example of a chamber-status monitoring method in a semiconductor fabrication according to another embodiment.

Next, chamber-status monitoring methods will be described in detail with reference to FIGS. 5 and 6. FIGS. 5 and 6 illustrate flow charts of chamber-status monitoring methods for use in a semiconductor fabrication process according to embodiments.

First, a method of measuring spectrum information of an OTDM signal in the multi-input optical emission spectroscope 40, processing the spectrum information of the OTDM signal in the controller 50 by using software so as to obtain optical signals of individual chambers 10, and controlling endpoint detection on each of the chambers 10 on the basis of the optical signal of the corresponding chamber 10 will be described with reference to FIG. 5.

In operation S10, the time-division multiplexer 30 connected between the multi-input optical emission spectroscope 40 and each of the plurality of chambers 10 may receive optical signals according to plasma emission from each of the chambers 10 performing an etching process. The time-division multiplexer 30 may receive the optical signal through the plurality of the optical fiber probes 20 corresponding to the plurality of the chambers 10, e.g., each chamber 10 may be connected to the time-division multiplexer 30 via at least one separate optical fiber probes 20.

Then, as illustrated in operation S20, the time-division multiplexer 30 may divide each of the received optical signals into time slots having predetermined time durations, and may multiplex the time slots to generate an OTDM signal. Next, as indicated by operation S30, the time-division multiplexer 30 may output the OTDM signal to the multi-input optical emission spectroscope 40.

Sequentially, as indicated by operation S40, the multi-input optical emission spectroscope 40 may disperse the OTDM signal received from the time-division multiplexer 30 according to wavelengths in order to measure spectrum information. Next, the multi-input optical emission spectroscope 40 may output the measured spectrum information of the OTDM signal to the controller 50, i.e., operation S50.

The controller 50 may divide the spectrum information of the OTDM signal into time slots to obtain spectrum information of the optical signals of the individual chambers 10, i.e., operation S60. Next, the controller 50 may control endpoint detection in each of the chambers 10 on the basis of the spectrum information of the optical signal of the corresponding chamber 10, i.e., operation S70.

Next, a method of obtaining the optical signals of the individual chambers 10 from the OTDM signal by the multi-input optical emission spectroscope 40 and controlling endpoint detection in each of the chambers 10 on the basis of the optical signal of the corresponding chamber by the controller 50 will be described with reference to FIG. 6.

The time-division multiplexer 30 connected between the multi-input optical emission spectroscope 40 and each of the plurality of the chambers 10 may receive optical signals according to plasma emission from the individual chambers 10 performing etching processes through the optical fiber probes 20, i.e., operation S100.

Then, the time-division multiplexer 30 may divide the optical signals into time slots having a predetermined time duration and may multiplex the time slots to generate an OTDM signal (S200), and may output the OTDM signal to the multi-input optical emission spectroscope 40 (S300).

Sequentially, the multi-input optical emission spectroscope 40 may disperse the OTDM signal according to wavelengths to measure spectrum information (S400), and may divide the spectrum information of the OTDM signal into time slots to obtain spectrum information of the optical signals of the individual chambers 10 (S500).

Next, the multi-input optical emission spectroscope 40 may output the spectrum information of the optical signals of the individual chambers 10 to the controller 50 (S600). The controller 50 may control endpoint detection in each of the chambers 10 on the basis of the spectrum information of the optical signal of the corresponding chamber (S700).

As described above, according to example embodiments, a single multi-input optical emission spectroscope may measure spectrum information of an OTDM signal corresponding to multiple optical signals of multiple respective chambers in a time division multiplexing scheme, thereby simultaneously measuring the status of the multiple respective chambers. As such, a number of optical emission spectroscopes required in a semiconductor fabrication process may be reduced, thereby reducing overall fabrication costs. Moreover, it may be possible to prevent a measurement error between chambers connected to one optical emission spectroscope and to improve the accuracy of endpoint detection and the degree of precision of the etching processes. Further, since one optical emission spectroscope is used, calibration control of the optical emission spectroscope according to change in chamber status may be eliminated, and low-cost high-resolution measurement of the status of each chamber at multiple points may be measured. Such spatial profile measurement may result in high resolution measurement, increased accuracy of endpoint detection, and enhanced reliability of an etching process, thereby reducing costs of the semiconductor fabrication.

In contrast, a conventional apparatus may include a separate optical emission spectroscope connected to each processing chamber for detecting an endpoint in a semiconductor fabrication process, so plasma emission during an etching process in each individual chamber may be transmitted to a respective optical emission spectroscope to determine spectrum information. However, as multiple optical emission spectroscopes are used in the conventional apparatus, calibration control may be required in the optical emission spectroscopes in response to a status change of a corresponding chamber. Moreover, since expensive optical emission spectroscopes are connected in one-to-one correspondence with chambers, it may increase manufacturing costs.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A chamber-status monitoring apparatus for use in semiconductor fabrication, the apparatus comprising:
    a plurality of chambers configured to perform etching processes on semiconductor wafers;
    a time-division multiplexer connected to each of the chambers via at least one respective optical fiber probe, the time-division multiplexer being configured to receive, via the at least one respective optical fiber probe, an optical signal from each chamber in accordance with corresponding plasma emission in the chamber, to divide each optical signal into first time slots having a predetermined duration, and to multiplex the first time slots of all the optical signals to generate an optical time-division multiplexed (OTDM) signal;
    a multi-input optical emission spectroscope connected to the time-division multiplexer via an optical fiber probe, the multi-input optical emission spectroscope being configured to receive the OTDM signal from the time-division multiplexer and to disperse the OTDM signal according to wavelengths to measure spectrum information; and
    a controller configured to divide the spectrum information of the dispersed OTDM signal into second time slots with a predetermined time interval therebetween, to classify the second time slots according to the chambers to obtain spectrum information of the optical signals of the individual chambers, and to control endpoint detection in each of the chambers in accordance with the spectrum information of the optical signal of the corresponding chamber.

2. The apparatus as claimed in claim 1, wherein the multi-input optical emission spectroscope includes:
    a grating configured to disperse the OTDM signal according to wavelengths;
    a CCD module configured to convert the dispersed OTDM signal into an electrical signal; and
    a signal processor configured to process the electrical signal to obtain the spectrum information of the OTDM signal and to output the spectrum information of the OTDM signal to the controller.

3. The apparatus as claimed in claim 1, wherein the controller is configured to classify the spectrum information of the OTDM signal into the spectrum information of the optical signals of the individual chambers by collecting the second time slots at time intervals of $(N_{max}-1)\cdot \Delta T + N_{max}\cdot \delta$,
    wherein $N_{max}$ is a maximum allowable number of chambers, $\Delta T$ is the predetermined duration of the first time slots, and $\delta$ is the predetermined time interval between the second time slots.

4. The apparatus as claimed in claim 1, wherein each of the plurality of chambers is connected to the time-division multiplexer via a plurality of optical fiber probes, each of the plurality of optical fiber probes being connected to a different position within a respective chamber.

5. A chamber-status monitoring apparatus for use in semiconductor fabrication, the apparatus comprising:
    a plurality of chambers configured to perform etching processes on semiconductor wafers;
    a time-division multiplexer connected to each of the chambers via at least one respective optical fiber probe, the time-division multiplexer being configured to receive, via the at least one respective optical fiber probe, an optical signal from each chamber in accordance with corresponding plasma emission in the chamber, to divide each optical signal into first time slots having a predetermined duration, and to multiplex the first time slots of all the optical signals to generate an optical time-division multiplexed (OTDM) signal;
    a multi-input optical emission spectroscope connected to the time-division multiplexer via an optical fiber probe, the multi-input optical emission spectroscope being configured to receive the OTDM signal from the time-division multiplexer, to disperse the OTDM signal according to wavelengths to measure spectrum information, to divide the spectrum information of the dispersed OTDM signal into second time slots with a predetermined time interval therebetween, and to classify the second time slots according to the chambers to obtain spectrum information of the optical signals of the individual chambers; and
    a controller configured to control endpoint detection in each of the chambers in accordance with the spectrum information of the optical signal of the corresponding chamber.

6. The apparatus as claimed in claim 5, wherein the multi-input optical emission spectroscope includes:
    a grating configured to disperse the OTDM signal according to wavelengths;
    a CCD module configured to convert the dispersed OTDM signal into an electrical signal; and
    a signal processor configured to process the electrical signal to obtain the spectrum information of the OTDM signal, to divide the spectrum information of the OTDM signal into the second time slots, to classify the second time slots according to the chambers to obtain spectrum information of the optical signals of the individual chambers, and to output the spectrum information of the optical signals of the individual chambers to the controller.

7. The apparatus as claimed in claim 5, wherein the multi-input optical emission spectroscope is configured to classify the spectrum information of the OTDM signal into the spectrum information of the optical signals of the individual chambers by collecting the second time slots at time intervals of $(N_{max}-1) \cdot \Delta T + N_{max} \cdot \delta$, wherein $N_{max}$ is a maximum allowable number of chambers, $\Delta T$ is the predetermined duration of the first time slots, and $\delta$ is the predetermined time interval between the second time slots.

8. The apparatus as claimed in claim 5, wherein each of the plurality of chambers is connected to the time-division multiplexer via a plurality of optical fiber probes, each of the plurality of optical fiber probes being connect to a different position within a respective chamber.

9. A chamber-status monitoring method for use in semiconductor fabrication, the method comprising:

receiving via a plurality of optical fiber probes optical signals from each of a plurality of respective chambers in accordance with corresponding plasma emission during etching in the chambers;

dividing each optical signal into first time slots having a predetermined duration, and multiplexing the first time slots of all the optical signals to generate an optical time-division multiplexed (OTDM) signal for a single multi-input optical emission spectroscope;

dispersing the OTDM signal in the single multi-input optical emission spectroscope according to wavelengths to measure spectrum information;

dividing the spectrum information of the dispersed OTDM signal into second time slots with a predetermined time interval therebetween;

classifying the second time slots according to the chambers to obtain spectrum information of the optical signals of the individual chambers; and controlling endpoint detection in each of the chambers in accordance with the spectrum information of the optical signal of the corresponding chamber.

10. The method as claimed in claim 9, wherein dividing the spectrum information and classifying the second time slots is performed by the multi-input optical emission spectroscope.

11. The method as claimed in claim 9, wherein dividing the spectrum information and classifying the second time slots is performed by a controller.

12. The method as claimed in claim 9, wherein controlling the endpoint detection is performed simultaneously in all the chambers via a single classifying the second time slots includes collecting the second time slots at time intervals of $(N_{max}-1) \cdot \Delta T + N_{max} \cdot \delta$, wherein $N_{max}$ is a maximum allowable number of chambers, $\Delta T$ is the predetermined duration of the first time slots, and $\delta$ is the predetermined time interval between the second time slots.

13. The method as claimed in claim 9, wherein controlling the endpoint detection is performed simultaneously in all the chambers in the single multi-input optical emission spectroscope.

* * * * *